United States Patent
Fiekowsky et al.

(10) Patent No.: US 7,472,372 B1
(45) Date of Patent: Dec. 30, 2008

(54) FAST IMAGE SIMULATION FOR PHOTOLITHOGRAPHY

(75) Inventors: Peter J. Fiekowsky, 952 S. Springer Rd., Los Altos, CA (US) 94024; Richard E. Schuster, Milpitas, CA (US)

(73) Assignee: Peter J. Fiekowsky, Los Altos, CA (US)

( * ) Notice: Subject to any disclaimer, the term of this patent is extended or adjusted under 35 U.S.C. 154(b) by 373 days.

(21) Appl. No.: 11/269,910

(22) Filed: Nov. 8, 2005

(51) Int. Cl.
  *G06F 17/50* (2006.01)
(52) U.S. Cl. .................................. 716/19; 716/21
(58) Field of Classification Search ............. 716/19–21; 382/144; 430/5, 22, 30
  See application file for complete search history.

(56) References Cited

U.S. PATENT DOCUMENTS

| | | |
|---|---|---|
| 6,765,651 B1 | 7/2004 | Fiekowsky et al. |
| 2005/0257187 A1* | 11/2005 | Gallatin et al. ............... 716/21 |
| 2006/0048090 A1* | 3/2006 | Feldman ........................ 716/21 |
| 2006/0208205 A1* | 9/2006 | Chen et al. ............. 250/492.22 |

* cited by examiner

*Primary Examiner*—Paul Dinh
(74) *Attorney, Agent, or Firm*—Beyer Law Group LLP

(57) ABSTRACT

A fast method simulates photolithography using conventional image processing techniques. Convolution simulates blurring due to optics; erosion and dilation correct for edge diffraction. To produce the convolution kernel, an effective projection lens image for the image source is produced by convolving the lens image with an image of the illuminator aperture shape. An effective projection lens image for the stepper is produced similarly. The stepper effective lens image is divided by the image source effective lens image to produce a corrected effective lens image. A corrected convolution kernel is produced by taking a Fourier transform of the corrected effective lens image. The kernel is used to convolve the image, once using energy and once using voltage, and then squaring the result. The aerial image is produced by blending the energy and voltage convolutions according to the computed partial coherence of the optics. Complex convolution is used to represent relative phases other than 180 degrees.

15 Claims, 9 Drawing Sheets

FAST IMAGE SIMULATION FOR PHOTOLITHOGRAPHY

FIELD OF THE INVENTION

The present invention relates generally to photolithography. More specifically, the present invention relates to the simulation of an image during semiconductor manufacturing.

BACKGROUND OF THE INVENTION

Photolithography is the process of transferring geometric shapes on a photographic mask to the surface of a silicon wafer; it falls under the more broad category of microlithography. A photographic mask (or "photomask"), typically a glass plate with a patterned emulsion of metal film on one side, is used in photolithography to create integrated circuits. Chromium (chrome) is typically used to produce the pattern on the photomask.

The successful manufacture of advanced sub-micron sized semiconductor devices requires accuracy in production of the photomask, and in the photolithography processes used to pattern the wafer. Photolithography processes for semiconductor manufacturing frequently use image simulation for predicting the outcome of the manufacturing process. Simulation allows an evaluation of the quality of the product before spending time and money producing the actual product. The simulation takes as input either the electronic, geometrical design of the circuit to be produced, or the observed photomask image made from that design. The output is either a representation of the image as formed on the resist on the wafer, the so-called "aerial image," or a representation of the result after the wafer has been exposed and developed.

The current standard procedure, as implemented in products such as VSS by Numerical Technologies, Inc. and Pro-Lith by KLA-Tencor, is to use the Hopkins Method for modeling the electric fields that create the final image on the wafer. The Hopkins method is described in the following references, which are incorporated by reference: the Kirchauer Thesis; Professor Neureuther's work on UC Berkeley's "SPLAT" simulation program, available from the University of Berkeley; and A. K. Wong and A. R. Neureuther, *Rigorous Three-Dimensional Time-Domain Finite-Difference Electromagnetic Simulation for Photolithographic Applications*, IEEE Trans. Semicond. Manufact., 8(4):419-431, November 1995).

The Hopkins Method requires a large number of calculations, and therefore is quite slow. A faster technique for simulating an image would be highly desirable. Faster simulation is important anywhere simulation is used. In photomask defect detection and analysis it allows determination of defect severity on the resultant wafer at a rate similar to the speed of current mask inspection machines. This greatly reduces the number of false defects reported while increasing the available sensitivity of inspections. Reduced false defect reports decreases costs involved with 1) reviewing reported defects 2) repairing false defects 3) damage caused by repair, and 4) re-inspecting masks after repair. Increasing sensitivity allows using existing inspection machines for newer, smaller geometry chip designs.

Fast simulation is also important for chip design and photolithography process development. A faster simulation method would allow more iterations of a chip design to optimize feature placement and optical enhancement techniques. Recent products, such as KLA-Tencor's "DesignSmart" use large parallel computers to perform simulation. Fast simulation would allow this simulation to be accomplished by a single processor at much lower cost for both hardware and software.

SUMMARY OF THE INVENTION

To achieve the foregoing, and in accordance with the purpose of the present invention, a fast method of simulating the results of imaging and wafer processing using conventional image processing techniques and an improved convolution technique is disclosed. The present invention uses conventional image processing techniques to produce an improved result with less computation. A typical speed increase is 500× compared to the Hopkins Method.

No technique for simulation will be perfect. For example, if the video inspection machine that creates an image of the photomask design has exactly the same optics as the stepper then no correction of the photomask image would be necessary. At the other extreme, if a perfect source microscope could be used that had no blurring whatsoever then likewise no correction would be needed. But the reality of measurement is somewhere in between and there is thus a need to remove blurring from a photomask image in order to obtain a highly accurate simulation. An accurate simulation is especially desirable with more complicated lens and illumination configurations. The present invention provides a solution to that need.

In a first embodiment of the invention, the transmission optical source image of the photomask is dilated to remove edge diffraction. This produces a simulated physical image corresponding to a theoretical infinite resolution optical microscope. This intermediate simulated physical image is eroded, and then convolved according to the resolution of the stepper at the photomask plane. Convolution involves producing an effective projection lens image for the image source as well as an effective projection lens image for the stepper, and then producing a corrected effective lens. This convolution produces a simulated image projected onto the wafer, or a "simulated wafer aerial image." This aerial image can then be further eroded to match the effects of resist and developing, producing a "simulated wafer resist image." Optional thresholding may be performed on the simulated wafer resist image to produce a simulated processed wafer image. Thresholding is described in Russ mentioned above, incorporated by reference herein.

In a second embodiment of the invention useful in practice, several steps are combined. The microscope resolution is typically two to three times higher than the stepper resolution being simulated. This fact allows steps to be combined because deconvolution as a separate step is not required. Thus, the deconvolution step may be eliminated by reducing the amount of blurring used to produce the aerial image. In addition, the dilation and erosion steps used to produce the aerial image are combined into a single erosion.

Where a phase shift mask is involved, a complex convolution is used. A phase shift mask has areas where the glass substrate is thinned, usually by an amount that causes the light to be delayed by ½ wavelength, or a phase of 180 degrees. This phase shift of 180 degrees causes dark destructive interference at the edge between the shifted and unshifted areas. The interference causes edges to appear sharper on the wafer, and that allows for more focus and illumination error during printing while yielding good devices. This technique is explained in Kirchauer, cited above.

Complex convolution is the same as standard convolution except that the data (images and kernel) are complex numbers that represent magnitude and phase. The pixel values in the source image are converted from energy to voltage by taking the square root. At the end the pixel values are squared to convert voltage back to energy or magnitude. Basically, an image is converted to complex values (electric field and phase) where there is a fixed phase difference between the clear and dark regions. This requires knowing the design phase difference (typically 180 degrees) and transmission through the dark areas, typically 0% or 6% of the clear transmission, depending on the type of phase shift mask at the stepper wavelength. Other values of phase shift and transmission can be simulated, although the literature does not discuss their use at this time.

The source image is then adjusted by replacing the original dark area values by the design transmission values, and then setting the phase information by setting it to zero typically for the clear pixels, and setting it to the design phase for the dark pixels. In alternating type phase shift masks the phase of the dark areas is set to zero, and the clear areas are set alternately to zero and the design phase. The convolution kernel has a gaussian intensity distribution, and an optional phase part that corresponds to the illumination partial coherence, as described in Kirchauer, above. After the complex convolution the pixel values are squared to convert the electric field values back to energy or intensity.

Thus, a fast image simulation results. Using the ProLith product from KLA-Tencor on similar images, for example, an image can be simulated 1,000 times faster while using a CPU fourteen times slower (total of 14,000 times faster) than reported by Intel Corporation in *Primadonna: A System For Automated Defect Disposition Of Production Masks Using Wafer Lithography Simulation*, by Dan Bald et al., SPIE Bacus 2002. Further, the source data can come from an image generated from the photomask electronic design or from an optical or non-optical (such as SEM, FIB, AFM) image of the actual photomask.

The simulated image may then be used to calculate edge position errors, CD errors, feature position errors and contrast errors. Because the simulation occurs much more quickly, these measurements can be used to decrease false defect reports from inspection tools, and to allow for increased sensitivity of inspection tools. A faster simulation also helps to accelerate process development for new products by allowing more variables to be tried, and improves OPC (optical proximity correction) techniques as more adjustments can be tried.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

Figure 1A:
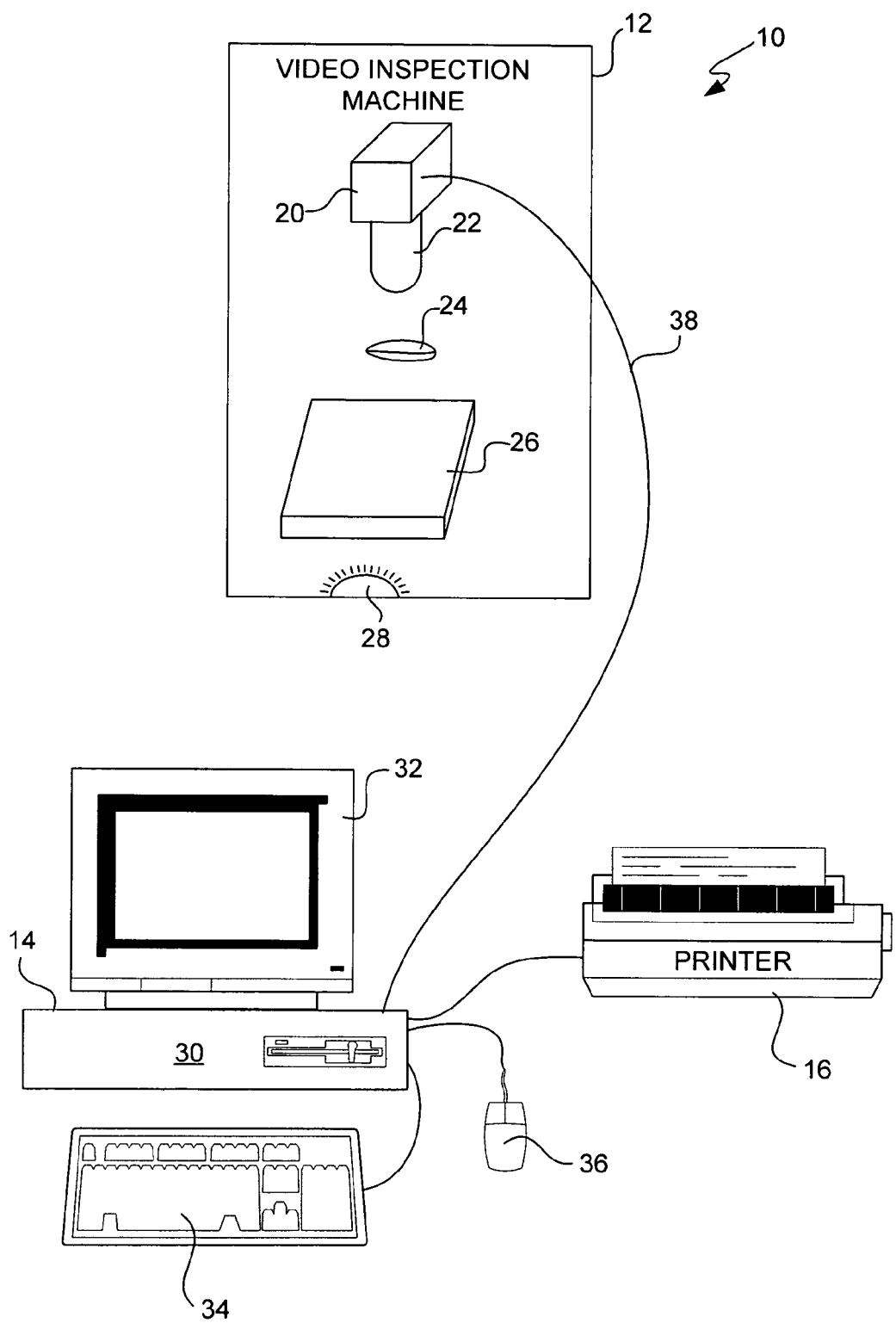
FIG. 1A illustrates a simulation system in accordance with an embodiment of the present invention.

FIG. 1A illustrates a simulation system 10 in accordance with an embodiment of the present invention. System 10 includes a video inspection machine 12, a computer system 30 and a printer 16. Video inspection machine 12 may be one of a wide variety of automatic inspection tools that analyze microscopic particles, lines, dimensions, etc., and outputs a video image of the item that it is analyzing. By way of example, machine 12 may be a KLA SLF or 5xx automatic inspection tool used for inspecting photographic masks that are used in the manufacture of semiconductor devices. Other measurement systems can be used such as KMS 100 from Zygo Corporation or LWM 250 uv from Leica Microsystems; other repair systems can be used such as DRS-2 from Quantronics, or simple microscopes can be used. Although the present invention is primarily designed for use with transmission microscope images, it can be used with reflection images with some loss in accuracy by using black-white reversal and erosion to simulate reflective edge diffraction.

Machine 12 includes a video camera 20 having a lens tube 22 and a lens 24 that is inspecting a medium 26. Light source 28 provides light from below medium 26 to allow for a transmission light image to be received by camera 20. Medium 26 may be one of a wide variety of media having microscopic features that are suitable for analysis by the present invention. By way of example, medium 26 is a glass reticule having a chrome pattern upon it forming a mask used in semiconductor manufacturing. Also, a wide variety of other media may be suitable for use with present invention. For example, media such as silicon wafers, printed circuit boards, other transparent media, and other types of masks may have analysis performed upon them using any of the various techniques of the present invention. In one embodiment, a multi-input option may be used in which two or more inspection machines of different types provide video data to the system. Other implementations may include using images derived from the mask design data or from non-optical images, such as from repair tools. Repair tools often create images from scanned electron beams (SEM) or focused ion beams (FIB) or from atomic force microscopes (AFM)

Figure 8A:
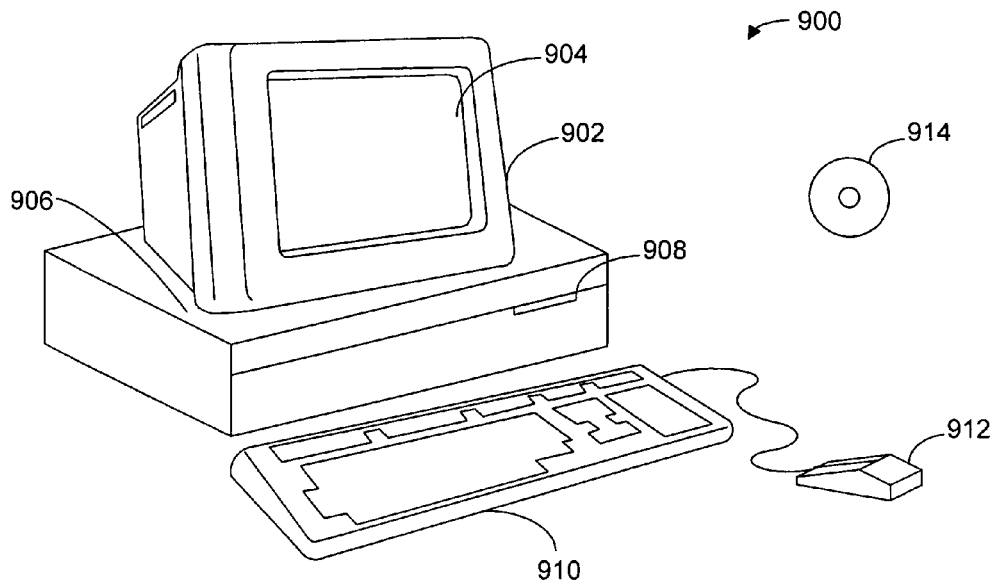
FIGS. 8A and 8B illustrate a computer system suitable for implementing embodiments of the present invention.
Figure 8B:
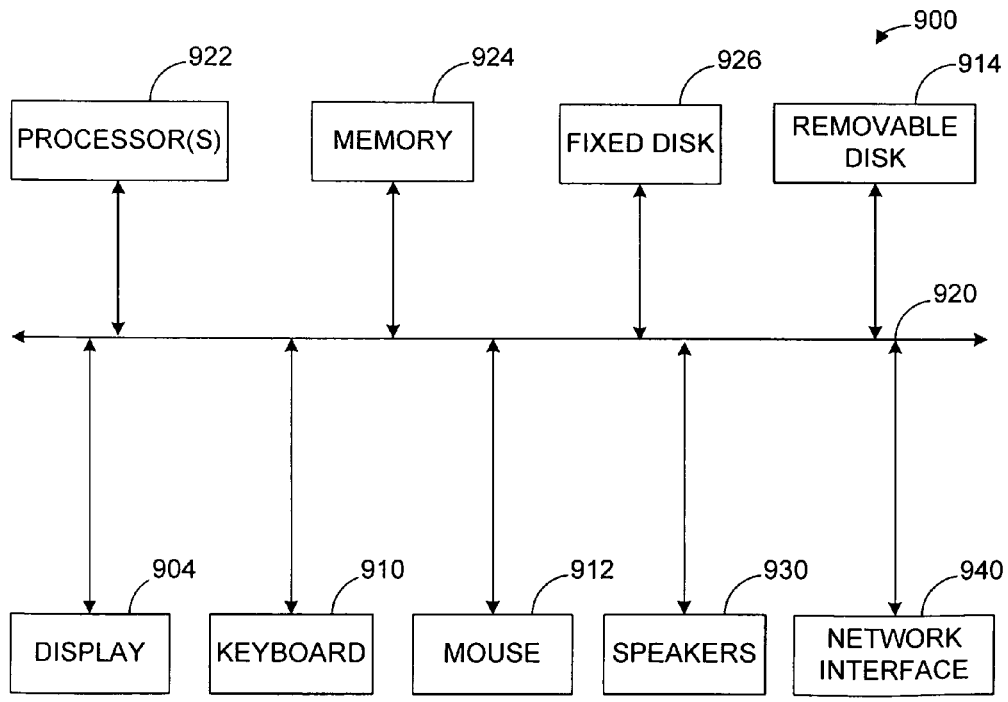

Computer system 30 may be any suitable computer system for embodying the present invention. By way of example, computer system 30 may be a personal computer with at least 64 MB memory, a CPU running faster than 200 MHz, and hard disk capacity larger than 5 GB, and any operating system, such as a Microsoft operating system, Sun Solaris, Linux, Apple OS X or others, having hardware 14, a high resolution monitor 32, a keyboard 34 and a mouse or track ball 36. Printer 16 is also connected to computer system 30 for allowing results of analysis to be printed. Computer system 30 is connected to machine 12 via cable 38 which may be a local area network or any suitable cable for transmitting raw video output data from machine 12 to computer system 30. Preferably, the video data from machine 12 travels in digital form via a local area network. Alternatively a video signal travels to high-resolution video capture hardware such as Flashbus Lite board from Integral Technologies in the computer that converts the video analog signal to digital form. A wide variety of computer configurations may be used; one alternative embodiment for a computer system 30 is shown in FIGS. 8A and 8B.

Figure 1B:
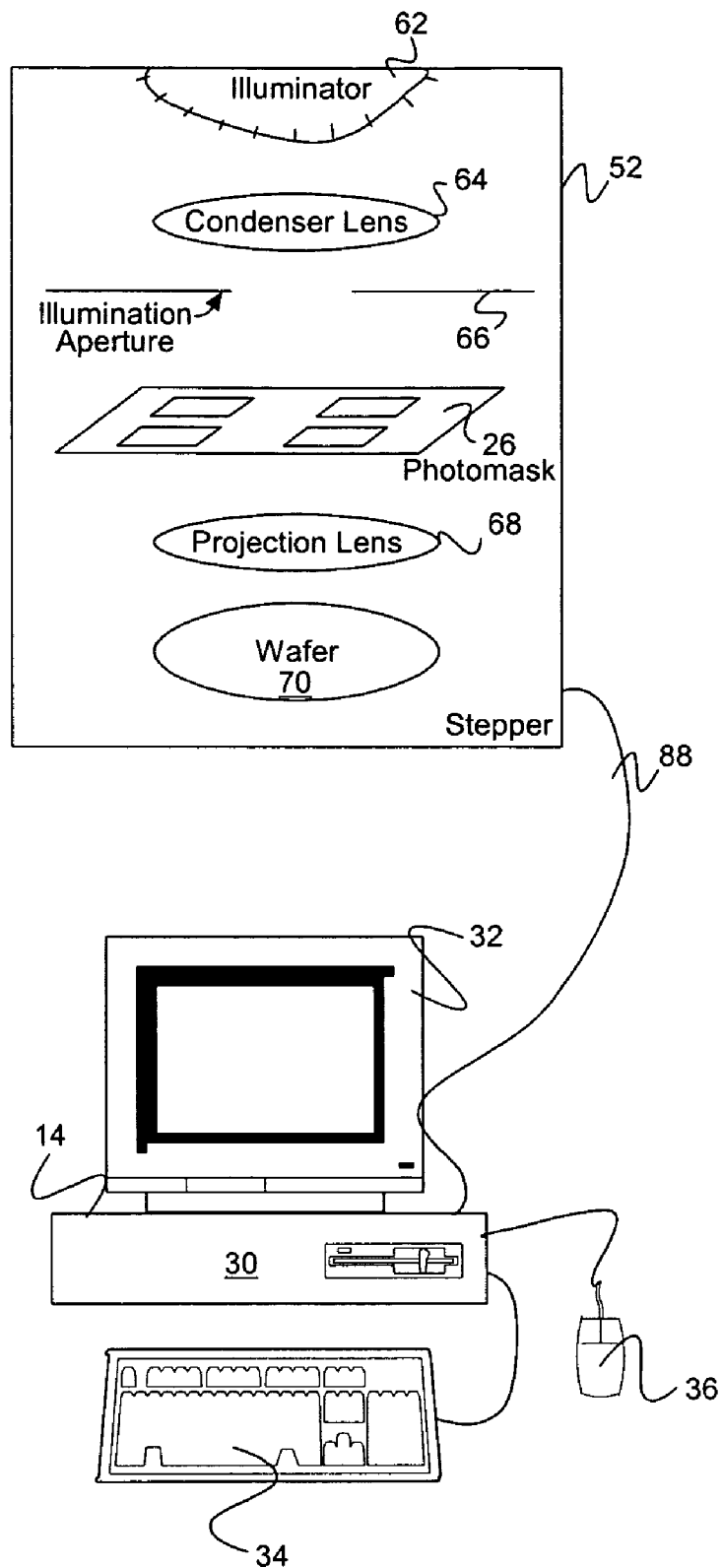
FIG. 1B illustrates a photolithography stepper useful in an embodiment of the invention.

FIG. 1B illustrates a photolithography stepper useful in an embodiment of the invention. A stepper (or projection printer) is a piece of equipment used in the manufacture of integrated circuits (among other applications) during the photolithography process. A stepper is simply a transparency projector, with the special application of projecting the microscopic features that comprise the integrated circuitry from a transparent mask onto a wafer.

Stepper 52 includes an illuminator or light source 62 (a mercury vapor lamp or an ultra-violet excimer laser, for example), a condenser lens 64, an illumination aperture 66, a photomask 26, a projection lens 68, and a wafer 70. The condenser lens images the light source onto the photomask or reticle and then the projection lens makes a reduced image of the photomask on the wafer. The wafer is then scanned or stepped into a new position, and the image is printed again. The term "stepper optics" refers to how light falls on the wafer and generally includes all of the optics inside the stepper, while the term "illuminator optics" refers only to the illumination aperture and the light coming from the illuminator. Illuminator optics are defined by the illumination aperture. The simplest aperture is a point source or a circle. Larger apertures generally produce higher resolution, and apertures that are dark in the center, such as annular apertures, reduce the contrast of large objects. Lithography engineers regularly create ever more complicated illumination apertures in order to produce sharp images on the wafer of ever smaller features. Most of the development of complicated apertures is proprietary to the semiconductor makers and stepper makers.

For example, ASML Model # PAS 2500 from ASML of the Netherlands and NSR-2205i11D from Nikon Precision are typical steppers. The stepper projects these features in a series of adjacent image areas by stepping the image of a photomask across the material (a wafer) that is being used to make the integrated circuits. Also, a high-resolution microscope, such as Leica DM IRM, or Nikon model E 600 may be used to most accurately determine the appearance and size of features on a photomask or the resultant wafer. For example, a scanning electron microscope (SEM) or an atomic force microscope (AFM) may be used. Simulation is used to reduce the need for such measurement tools.

Two optical processes are modeled to produce an accurate simulation more quickly: blurring and edge diffraction. Blurring is introduced by the optical resolution of the projection lens. This is defined in optical texts as the Rayleigh resolution criterion: Res=0.61λ/NA, where λ is the wavelength of light used in the microscope, and NA is the Numerical Aperture of the main microscope lens, a measure of the lens's diameter. NA is defined as NA=n/2f#, where n is the index of refraction of the glass, and f# is the ratio of the lens focal length to its diameter. Edge diffraction, as defined in elementary physics texts, causes opaque areas to appear larger in a microscope than if measured mechanically. The nature of this edge diffraction is that photons that graze close to the edge of an opaque area get diffracted away from the microscope objective lens, causing the opaque area to appear larger optically than it is physically. Convolution with a Gaussian kernel simulates the blurring; erosion and dilation simulate the edge diffraction. Convolution and deconvolution are known image processing techniques that can be performed by several methods, as described in *The Image Processing Handbook*, by John C. Russ, CRC Press, 1992, incorporated herein by reference.

Erosion is a known image processing technique and may be performed by replacing each pixel with the darkest of the nine pixels adjacent to it, including itself. Dilation is the opposite function, replacing each pixel with the brightest of the nine pixels adjacent to it, including itself. References to methods of performing erosion apply to dilation by replacing "minimum" by "maximum." In the literature these are referred to as gray scale erosion and gray scale dilation in "The Image Processing Handbook" mentioned above.

FIRST SIMULATION EMBODIMENT

As pointed out above, the present invention models blurring and edge diffraction to quickly produce an accurate simulation. As is commonly known, an image taken of a photomask (using a typical video inspection machine) having sub-micron dimensions will appear blurred as described above in the Rayleigh criterion by the resolution of the optical system. This blurring is corrected, typically by deconvolution. Images that come directly from the mask design, without optics, will not require this correction.

Photons that come closer to the edge than Res/4.4, where Res is the Rayleigh resolution, are diffracted beyond the opening of the objective lens and appear to be blocked by the dark area of the photomask. This diffraction causes dark areas to appear larger at low optical resolution than at high resolution. A dark line, which consists of two edges, is observed to be Res/2.2 larger than observed with an SEM, and a clear line is observed to be smaller by the same amount. Because these lines appear in a photomask image to be of different sizes than they actually are, it can prove difficult to produce a simulation of how the final wafer will appear. Advantageously, the present invention realizes that edge diffraction can be modeled, and be compensated for, by the known image processing functions called erosion and dilation. Erosion causes bright areas of the mask to shrink (erode), while dilation causes bright areas to expand. Dark areas are affected by erosion and dilation in the opposite way.

Figure 2:
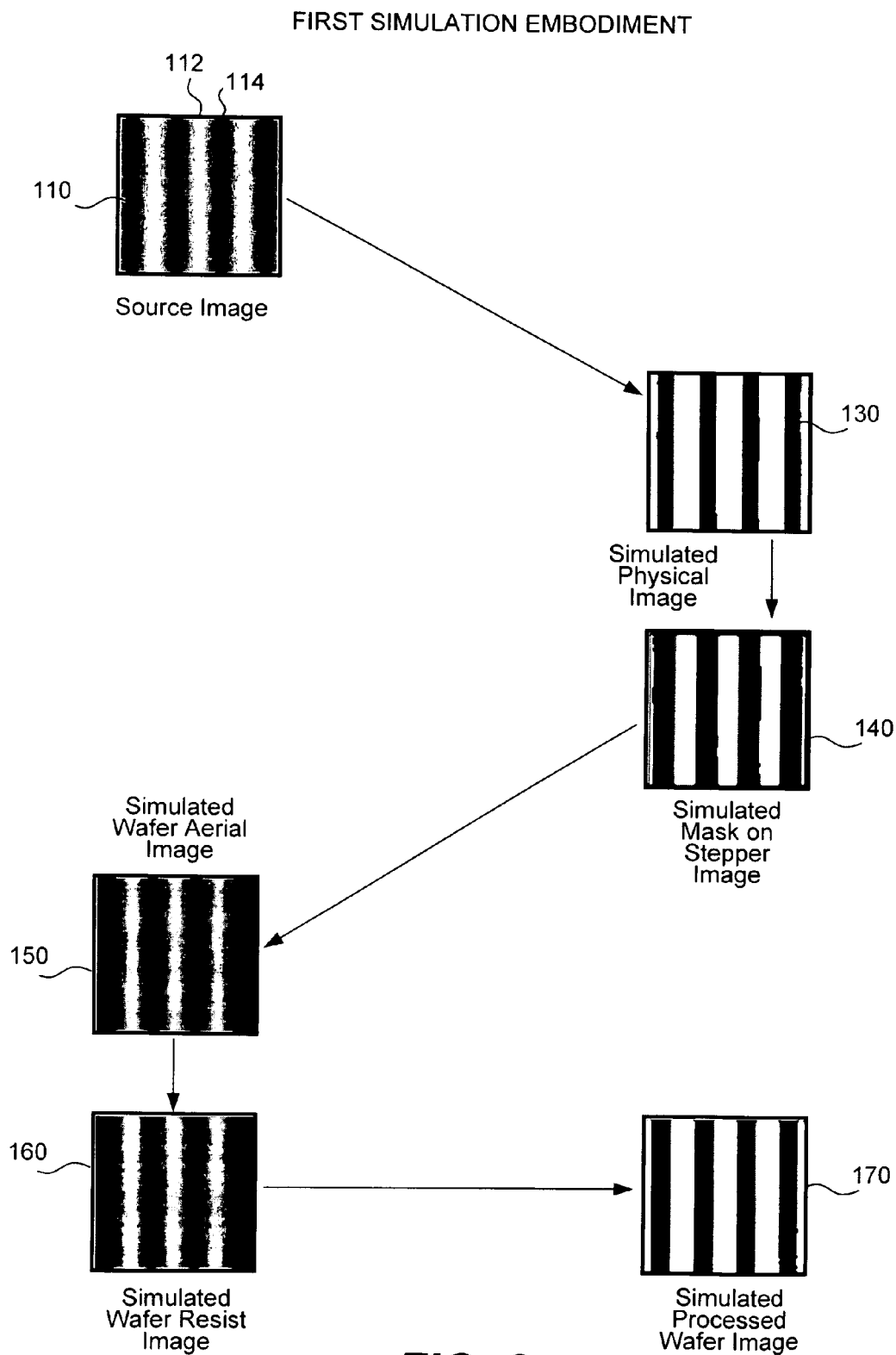
FIG. 2 illustrates a first embodiment for simulation using deconvolution, erosion and dilation.
Figure 3:
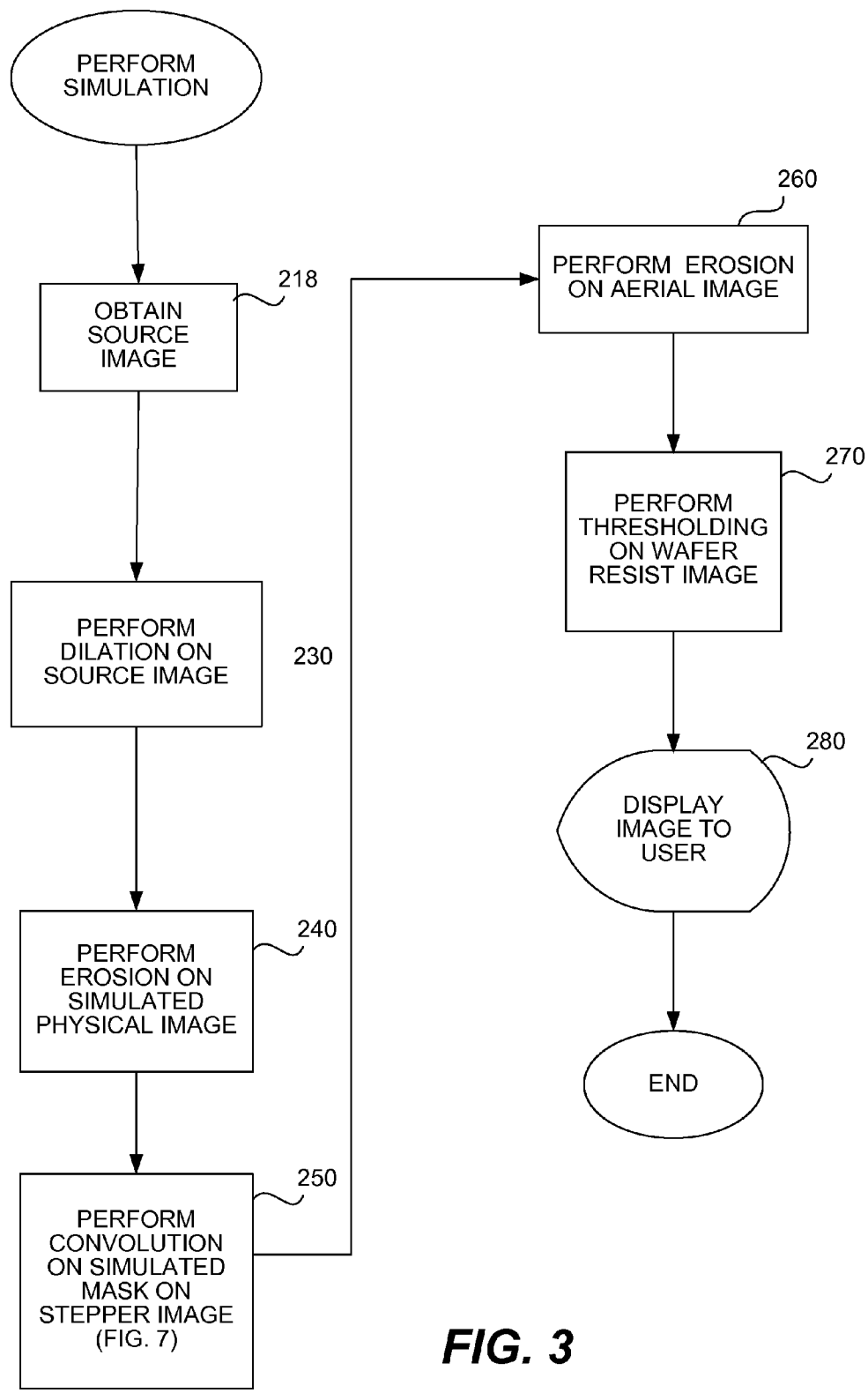
FIG. 3 is a flow diagram describing the simulation shown in FIG. 2.
Figure 4:
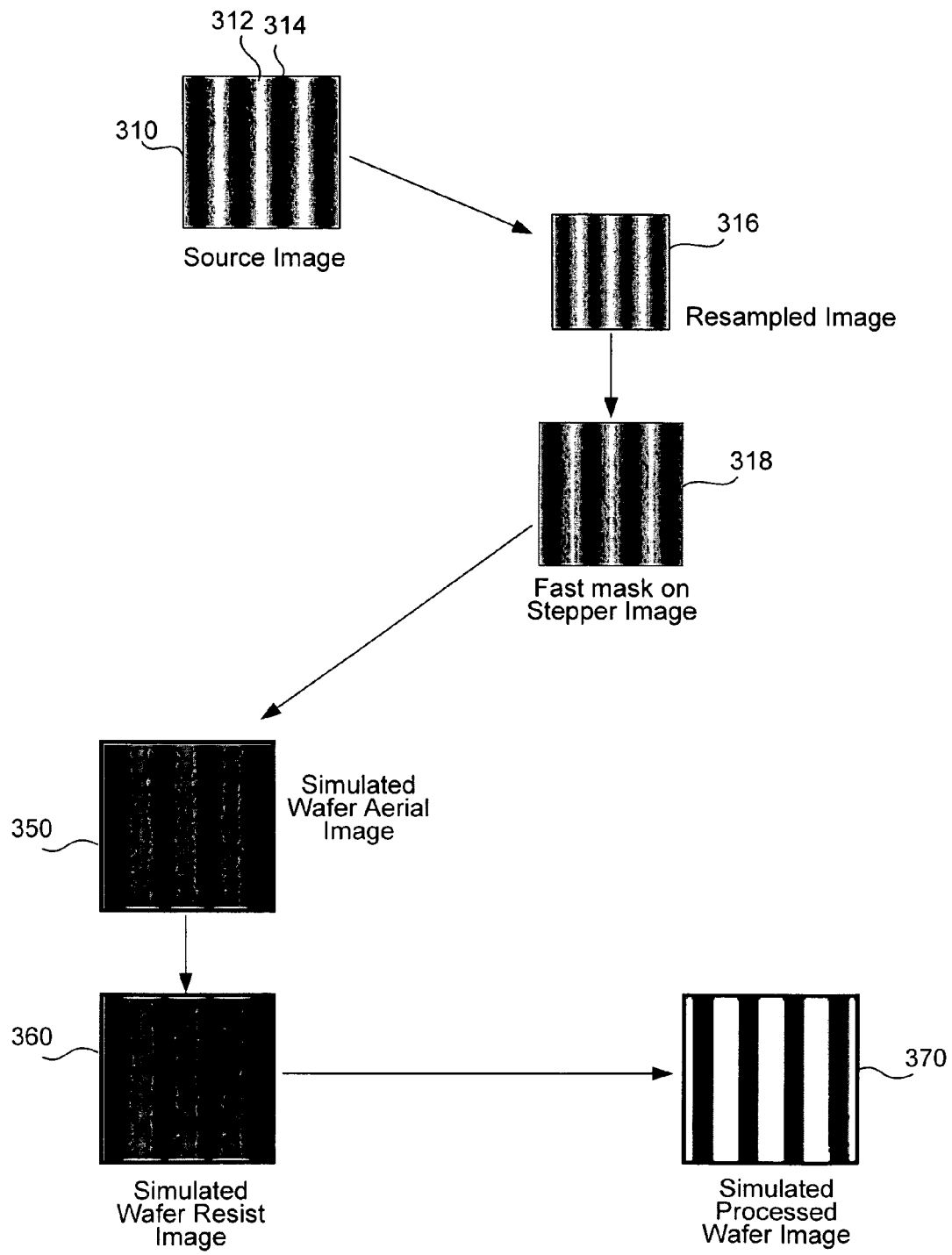
FIG. 4 illustrates a second embodiment for simulation using erosion and convolution.
Figure 5:
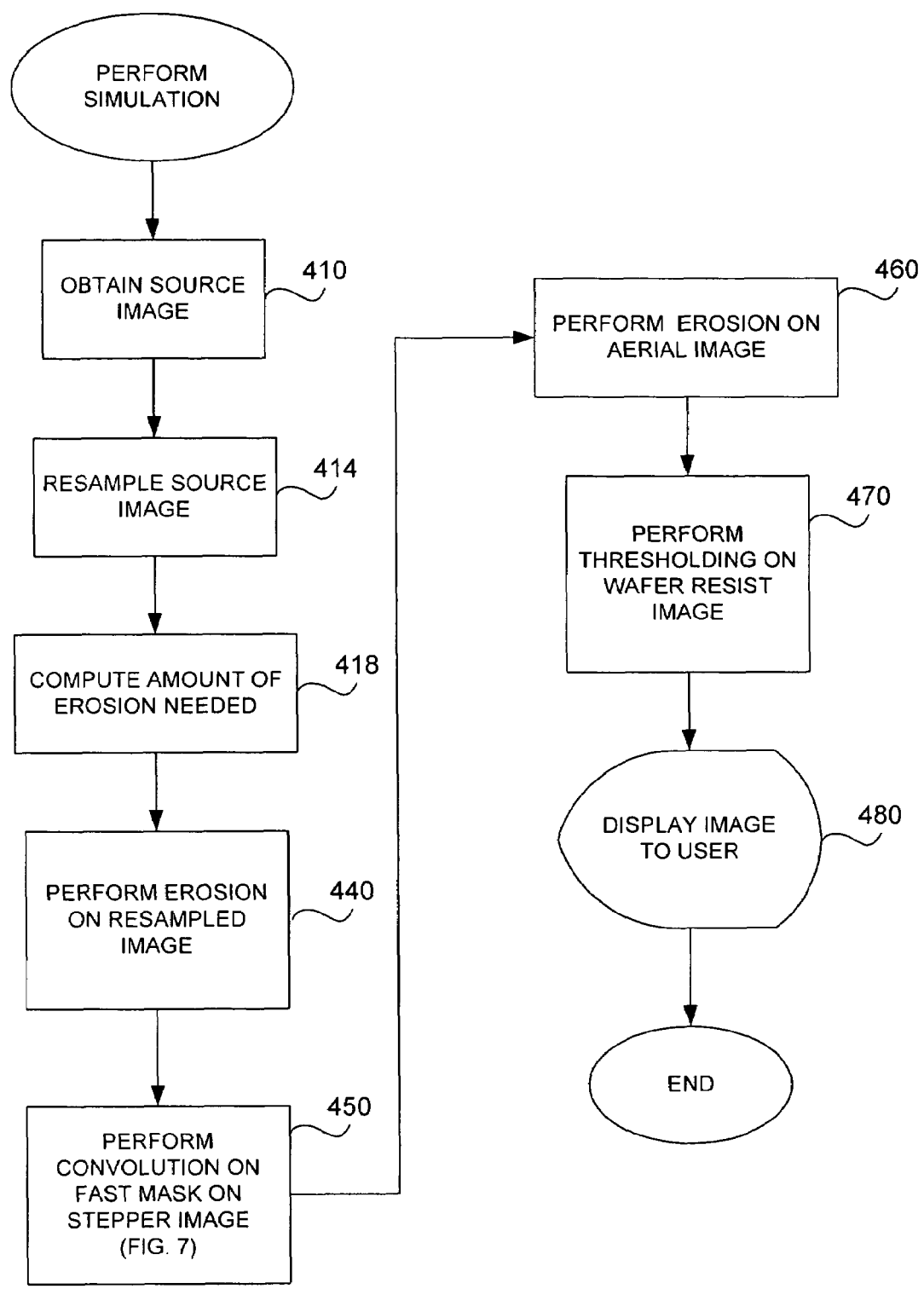
FIG. 5 is a flow diagram describing the simulation shown in FIG. 4.

FIG. 2 illustrates a first embodiment for simulation using erosion and dilation. FIG. 3 is a flow diagram describing the simulation shown in FIG. 2, and will be explained in the context of FIG. 2. In step 210 a source image 110 of a photomask is obtained. Image 110 is an image of only a portion of a photomask, used for ease of understanding the invention; larger regions are also possible. Preferably, image 110 is a digitized intensity source image obtained from an optical transmission source, such as any of the video inspection machines described above. Other types of images may be used, although it is preferable if they are converted to appear as an optical transmission image by converting the opaque areas to black, and the clear areas to white (or bright). Alternatively, the source image may be generated from the electronic photomask layout design. Generating the image from the electronic design is a step known to those of skill in the microlithography art and is typically performed by data management programs such as the CATS product from Numerical Technologies, Inc. Generating the image from the design is usually performed by simulating the action of the mask writing machine in software. The output is a binary image (black and white with no grays) that exactly corresponds to the mask to be made.

In this example, the image 110 of the photomask shows clear regions 112, which appear bright, and chrome lines of the photomask 114, which appear dark, four lines being shown. Of course, using other illumination techniques, the lines may originally appear bright and the clear regions may appear dark. In those cases the original image would be dark/bright reversed to produce this image. Shown for ease of understanding is a very simplistic image 110 with only four lines. Of course, the present invention is applicable to much more complex photomask designs, such as those found in a Pentium microprocessor chip from Intel.

Next, dilation and erosion are performed. A sub-pixel erosion technique works well, where the amount of erosion is intermediate between zero and one pixel. Erosion by fractional values greater than one pixel can be performed by repeated single pixel erosion, as described above, or by a single erosion using pixels in a larger neighborhood, such as the twenty-five pixels that are within a two-pixel distance from the original pixel. Sub-pixel erosion or dilation can be accomplished by several methods. These methods include: a) the preferred method of blending the original pixel with the eroded or dilated value (for example, an erosion of 0.4 pixel would add 40% of the eroded value to 60% of the original pixel); and b) rescaling the image to a different size in pixels (such as with the Microsoft operating system function "StretchDIBits"), so that the required erosion is a single pixel, and then eroding the image and rescaling it to the original size in pixels (a zoom in, erode, zoom out sequence). Both methods produce the same result. Other methods of producing the same results may be used. In this discussion erosion and dilation are assumed to be sub-pixel implementations.

In step 230, dilation is performed on image 110 to produce simulated physical image 130. As edge diffraction had appeared to widen lines 114, dilation corrects the edge positions of these lines, essentially shrinking them back to what their true physical appearance would be. Image 130 shows the lines as being slightly narrower. Dilation is a known image processing technique and may be performed by replacing each pixel with the brightest of the nine pixels adjacent to it, including itself.

Next, in step 240, erosion is performed on image 130 to produce a simulated mask on stepper image 140. The erosion of step 240 is used to correct the line widths to help match the effect of the resolution of the source image optics. Image 140 shows the lines as being slightly wider than those in image 130. Because the stepper has lower resolution optics than the source image optics, when the stepper projects the mask image onto the wafer, the chrome lines will be projected on the wafer as being relatively wider than they appear in the mask or design images. In order to simulate the aerial image, that is the image that will appear on the wafer, erosion is used to widen the dark lines to match the effects of the stepper optics, such as an ASML PAS 2500, as defined below in the equation for Ep. This erosion generally cancels out the dilation in step 230.

Figure 6:
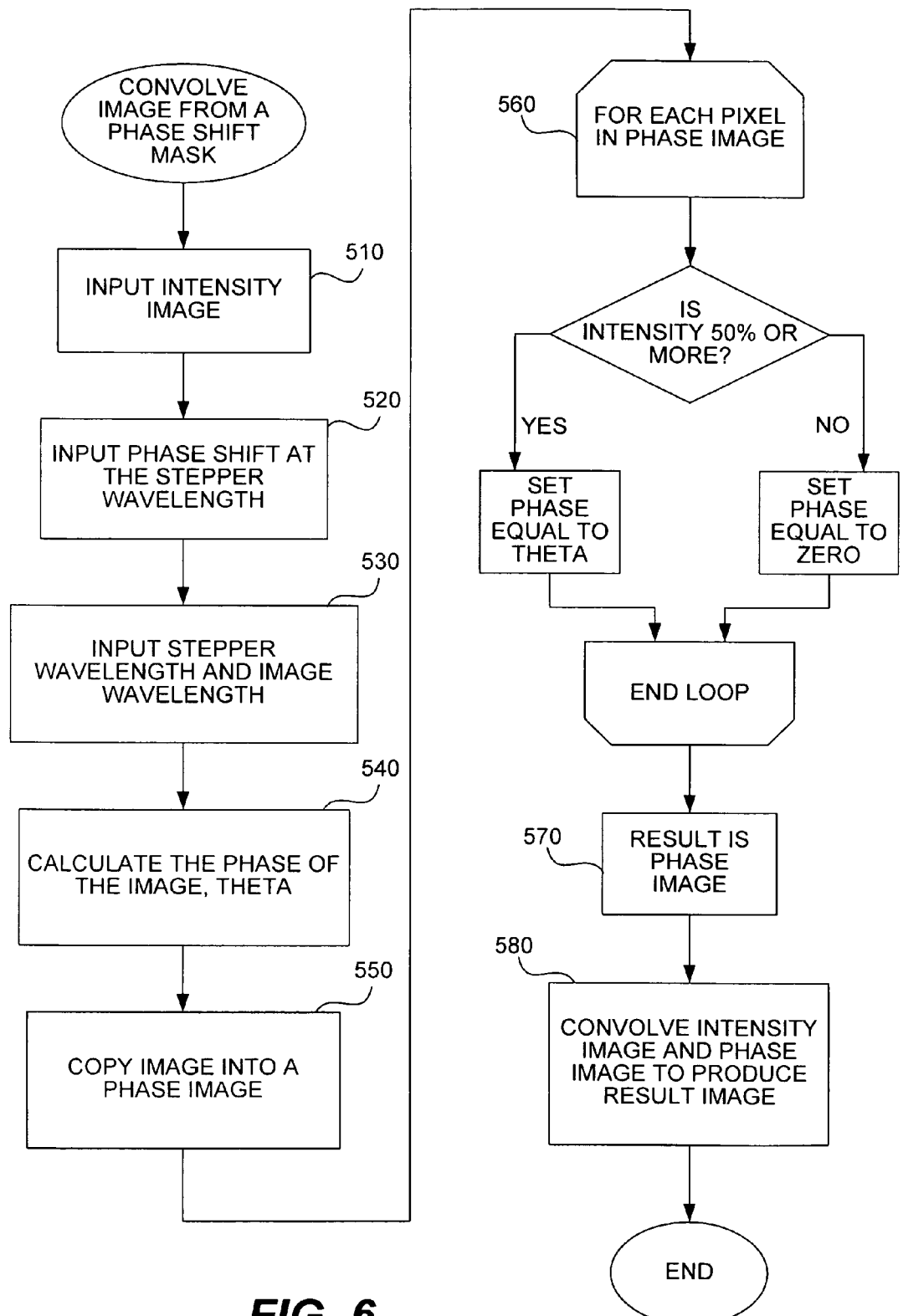
FIG. 6 is a flow diagram describing how convolution of an image may occur when a phase shift mask is involved.

Next, in step 250, convolution is performed on image 140. Preferably, convolution is performed as described below with reference to FIG. 7. The resultant image 150 is known as the simulated wafer aerial image, or simply as the aerial image. The aerial image is how the wafer would appear if photographic film were placed onto the wafer surface. Convolution is standard for a binary photomask. If a phase shift mask is used, complex convolution is needed, and a technique for performing such a convolution is shown in FIG. 6.

In some microlithography processes the simulated aerial image 150 is used for measurements. In other processes the wafer resist image is desired, for example, for line width measurements. Step 260 produces this wafer resist image. In step 260, erosion is performed again to simulate the effects of exposure and development of the photoresist and of wafer processing to produce a simulated wafer resist image 160. Image 160 is a simulation of how the wafer appears after both exposure and development. Preferably, erosion is performed as described herein. The amount of erosion is determined experimentally by adjusting the value so that the simulated image from a mask matches a SEM image of a wafer made from that mask. A common value for 150 nm wafer processes is 15 nm, determined as described above.

In step 270 an optional thresholding step is performed on the simulated wafer resist image 160 to produce a simulated processed wafer image 170. The threshold level may be determined manually or according to the wafer process specification. Image 170 simulates a SEM image of the wafer, showing the edges as bright and the flat areas as dark. Image 170 is often desired in order to compare to a SEM image of the wafer. The thresholding level is set to correspond to a particular exposure level, as is known in the art, thus image 170 represents an image of the wafer at a particular exposure level.

In step 280 an image is displayed to the user. This image may be image 150, 160 or 170, whichever image is required for the user's lithography process. The image is displayed on a computer display. This image can also be used to compare feature sizes and positions, such as for the purpose of determining if a size or position error will cause the resultant chip to malfunction. The image can also be used to determine if the designed shape of features on the mask will produce the intended result on the wafer, and if not the shapes are varied and the simulation can be repeated.

SECOND SIMULATION EMBODIMENT

In a second simulation embodiment, optimizations are used to speed up generation of the simulation, by a factor of 2 to 5× faster. For example, as dilation and erosion are sequentially applied to the image after deconvolution, it is possible to combine these two processing steps into a single erosion step. The single step ends up being an erosion (rather than a dilation) because the need to slightly widen lines (to match the stepper resolution) slightly outweighs the need to narrow lines due to edge diffraction in the source image optics. In other words, an erosion is performed, but the amount is reduced because of the dilation required. Or more simply, lines are widened to compensate for the stepper resolution, but not quite so much in order to compensate for the diffraction in the source image.

Also, because the source image resolution is high compared to the stepper resolution, the deconvolution step is not needed because image 310 is sharper than image 350. Since the image will be blurred anyway during convolution, the blurring is slightly reduced in order to compensate for the deconvolution step not being performed.

In step 410 a source image 310 of a photomask is obtained. Image 310 is an image of only a portion of a photomask, used for ease of understanding the invention; larger regions are also possible. Preferably, image 310 is a digitized intensity source image obtained from an optical transmission source, such as any of the video inspection machines described above. Other types of images may be used, although it is preferable if they are converted to appear as an optical transmission image by converting the opaque areas to black, and the clear areas to white (or bright). Alternatively, the source image may be generated from the electronic photomask layout design. Generating the image from the electronic design is a step known to those of skill in the art.

In this example, image 310 of the photomask shows clear regions 312 which appear bright, and chrome lines of the photomask 314 which appear dark, four lines being shown. Of course, using other illumination techniques, the lines may appear bright and the clear regions may appear dark. Shown for ease of understanding is a very simplistic image 310 with only four lines. The present invention is applicable to photomask designs of any complexity.

In step 414 the image is resampled to a lower resolution in order to reduce the number of pixels that must be processed, thus improving the processing time. Produced is an intermediate resampled image 316. A lower resolution that works well is preferably one-third of the stepper resolution at the photomask. The minimum resolution is one-half of the stepper resolution due to the Nyquist sampling theorem available from Wolfram Research. This description of the Nyquist sampling theorem is incorporated by reference. The preferred resolution is 2-4 pixels per stepper resolution. More pixels per micron will reduce the speed and slightly increase the accuracy. For example, assume the stepper magnification is 4×, the wavelength used is 0.25 microns, and NA is 0.8 at the wafer (thus, NA=0.2 at the photomask plane), then using the formula for resolution $Res=0.61\lambda/NA$, the stepper resolution at the mask in microns is $StpRes=0.61\times(0.25 \text{ microns})/0.2=0.76 \text{ microns}$.

Thus, the desired lower resolution per pixel is (0.76/4) or 0.19 microns per pixel. In other words, a desired lower resolution after resampling should be approximately 2-4 pixels per stepper resolution at the mask. Preferably, the resampling should be lossless, not using the "nearest neighbor" technique, as described in the *Image Processing Handbook* mentioned earlier. In lossless resampling, data from every source pixel is included in the resampled image. The resampled image may be enlarged at any time according to the preference of the user, using standard computer tools, such as Microsoft operating system display tools.

Next in step 418 the amount of erosion needed is calculated. In one embodiment, the amount of erosion required in fractional pixels is calculated. Where "Em" is the erosion in microns, "StpRes" is the stepper resolution in microns/pixel defined above, and "SrcRes" is the source image resolution in microns, $Em=(StpRes-SrcRes)/4.4$.

SrcRes is zero when the source image is computed from the electronic mask design. The factor of 4.4 is approximate. Its exact value can be derived from physical optics to achieve better precision although that will not have a significant effect on the overall system precision. Now, where "Ep" is the erosion in pixels and "Rscale" is the scale of the resampled image from the previous step in microns per pixel, we have $Ep=Em/Rscale$.

Ep will usually be less than one pixel. If Ep is greater than one pixel, then one or more whole pixel erosion operations are performed, and then a sub-pixel erosion is performed as needed.

Next, in step 440 erosion is performed on image 316 to produce a fast mask on stepper image 318. The erosion step 440 is used to correct the edge positions of the lines to help match the resolution of the stepper optics. Because the stepper has lower resolution optics than the video inspection machine, when the stepper projects the mask image onto the wafer, chrome lines will be projected on the wafer as being wider than they appear in the source image. Erosion is used to widen the lines to simulate how the stepper would widen them.

In a preferred embodiment of the invention, the convolution of step 450 is performed on fast mask on stepper image 318, thus producing simulated wafer aerial image 350, as described below with reference to FIG. 7.

Steps 460-480 are preferably performed as described in FIG. 3, in order to produce simulated wafer resist image 360 and simulated processed wafer image 370 which can be displayed to the user or used for measurement.

CONVOLUTION INVOLVING A PHASE SHIFT MASK

FIG. 6 is a flow diagram describing how convolution of an image may occur when a phase shift mask is involved. If an image represents a binary mask, convolution of that image may be performed using standard techniques. If an image represents a phase shift mask, however, the below technique works well in performing the convolution.

A binary mask typically has a clear substrate such as quartz or glass through which all light is transmitted; placed on top of this substrate are the regions of chrome which define the mask. The chrome regions do not transmit any light; hence the phrase "binary mask." A phase shift mask uses a clear substrate as well, but thinner chrome layers may be used. Also, regions of the substrate may be etched to define where chrome is placed. Infinite variations are possible regarding amount of etching and thickness of the chrome. As a consequence, while the substrate may still transmit all light, the regions defined by the chrome may transmit a small percentage of light, rather than none at all. Photons of light passing through the chrome are phase-shifted with respect to photons passing through the substrate. A phase shift mask, as opposed to a binary mask, is used in the industry in order to produce smaller features and increase immunity to focus and exposure errors.

Because of this phase shift, simulations of such a phase shift mask are convolved differently using complex images that include signal amplitude as well as relative phase, as described above.

In step 510 an intensity image is received. This is an intensity image that represents light transmitted through a phase shift mask. In step 520 the phase shift at the stepper wavelength is input. This is a known number, and is typically 180 degrees; however, other numbers such as may be measured on the actual may be used.

In step 530 the wavelength at the stepper is input. This is the wavelength of light that is used to project the image of the mask onto the semiconductor substrate. Also input is the wavelength of the image, this is the wavelength of light that is used to view the mask and to produce the intensity image. In step 540, the phase of the image, theta, is calculated using the formula: theta=180 degrees×wavelength(stepper)/wavelength(image).

In step 550, for ease of processing, the intensity image is copied into a placeholder phase image, which will then be adjusted. In loop 560, for each pixel in the phase image, if the intensity of the pixel is 50% or more, then the phase for that pixel is set equal to theta. If the intensity is less than 50%, then the phase for that pixel is set equal to zero. Of course, a cutoff other than 50% may also be used in order to represent under- or over-etching of the mask, where the phase change occurs at a slightly different location than the intensity change. The resultant phase image will thus have the associated phase for each pixel of the image.

Finally in step 580, the intensity image is convolved using known techniques described above, using the phase information from the complex image. Typically this is referred to as a "complex convolution." The resultant image is the convolution of the original intensity image.

CONVOLUTION

Figure 7:
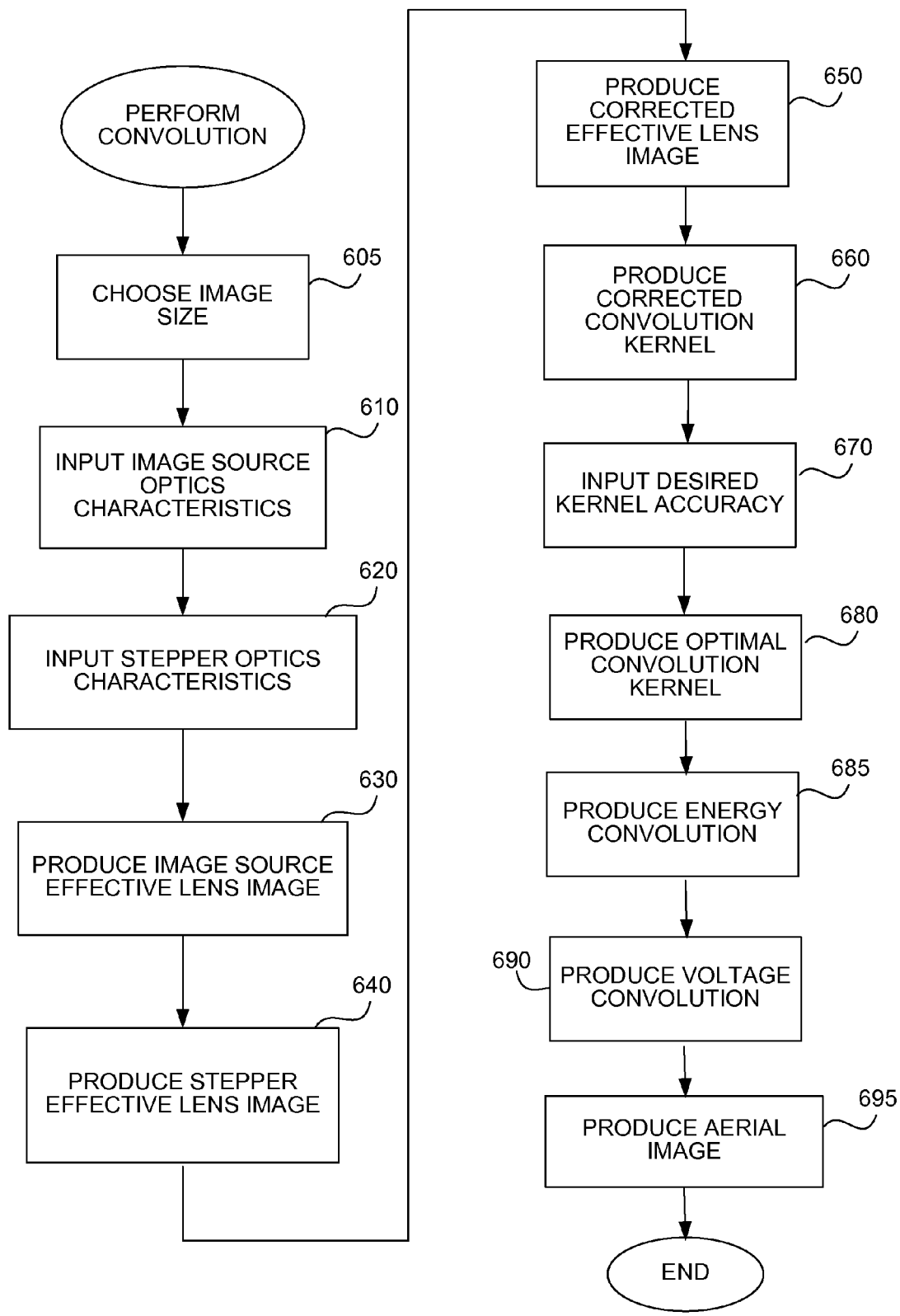
FIG. 7 is a flow diagram describing how convolution occurs using effective lens images.

FIG. 7 is a flow diagram describing a preferred embodiment for performing convolution. Convolution represents conceptually subtracting the image source optics from the stepper optics (the image source optics are the optical characteristics of the video microscope that produces the image of the photomask). The image source optics are taken into account because the input is the image of the mask rather than the theoretical mask design itself. This embodiment combines deconvolution with convolution. This embodiment also generates the convolution kernel by taking a Fourier transform of a corrected effective lens image (the effective projection lens image). The corrected effective lens image is produced using the image source effective lens image and the stepper effective lens image. The prior art does not discuss how to generate such effective lenses. Using the concept of effective lenses allows us to describe the effect of complex illuminators.

As is known in the art, a convolution process makes use of a convolution kernel. The convolution kernel embodies the entire optical transfer function of the stepper optics and of the image source optics. The optics in the stepper are determined by the illumination wavelength, the projection lens NA (Numerical Aperture), and the condenser lens sigma. Sigma is commonly defined as the condenser lens NA divided by the projection lens NA. For example, a point source illuminator has sigma of almost zero. When the illuminator has the same NA as the projection lens the sigma is one. The illumination aperture can be made more complicated by blocking the inside, by forming an annular illuminator, or by incorporating sets of holes or partially transparent sections. Any conceivable illuminator or condenser lens configuration can be described as transmissive shapes, where ordinarily the transmission is either 0 or 100%, but in practice can be any value between 0 and 1. This description of illuminator optics is well described in the literature and is implemented by existing simulation programs such as "ProLith" from KLA-Tencor.

Stepper optics are described mathematically as the transfer function of its "effective lens". The effective lens is the convolution of the illuminator shape and transmission by the projection lens shape and transmission. The projection lens shape is normally a circle with 100% transmission, although textbooks describe variations. In microlithography complicated illumination apertures are used to produce the desired image transfer functions.

For example, a point illuminator (sigma approaching zero) will generate an effective lens identical to the actual projection lens. A circular illuminator with the same NA as the projection lens (sigma=1) will produce a circular effective lens whose diameter is twice that of the projection lens and whose transmission profile forms a cone. The following convolution process models the effect of complicated lens and illumination configurations.

First the size of the FFT (fast Fourier transform) image is chosen in step 605. In the preferred implementation this size is fixed at 128 pixels/square (FFTSize). This size gives a good balance between speed in generating the kernel and accuracy of the kernel. Next, the characteristics of the source image optics and the stepper optics being modeled are input in steps 610 and 620. For example, for the source image optics, input are the illumination wavelength, NA and sigma. For the stepper optics, input are the wavelength, NA, sigma and illuminator aperture shape. Simple illuminator apertures, such as a circle, are defined by the sigma, while complicated apertures are input as image arrays.

In steps 630 and 640 the two effective lens images are computed, one effective lens image for the projection lens of the image source and one effective lens image for the projection lens of the stepper. For each, the effective lens image is produced by convolving the image of the illuminator aperture shape with the projection lens image and the transmission values of the aperture. First, we compute $RO=0.61\lambda/NA/PixelSize*1.8$. The factor of 0.61 comes from the common definition of lens resolution, and the correction factor of 1.8 has been experimentally determined to provide the best fit to actual microscope images. The PixelSize is the value used in the source image, typically 100 nm per pixel, or as defined in step 414. The projection lens (image source or stepper) is then drawn into the zero-filled starting image array as a circle with intensity=1, and diameter=FFTSize/R0. The illuminator image is drawn into another array in a similar fashion. If sigma=1 the illuminator diameter is the same number of pixels as the lens. Any partial transmission in the illuminator or lens is represented with proportional values in the array. The effective lens image is computed by convolving the two arrays. The above technique is performed twice: once for the source image optics (630) and once for the stepper optics (640).

The corrected effective lens image is produced in 650 by dividing the stepper effective lens image by the image source effective lens image, pixel-by-pixel. In pixels where the divisor is zero the result is set to zero. This division process is equivalent to deconvolving using Fourier transforms as described in signal processing textbooks. Next, the corrected convolution kernel is produced in 660 by taking the Fourier transform of the corrected effective lens image.

The next step (680) is to find the minimum kernel size required to deliver the desired accuracy in the final result. Convolution speed is proportional to the area of the kernel, so reducing the kernel size used by 50% results in a 4× speed increase. The starting kernel has the same size as the FFTsize, that is 128×128 pixels. Most of the energy is in the center of the kernel, so the low values near the edges can be left out with little effect on image quality. The desired convolution accuracy is input in step 670, and that value is used to determine the minimum kernel size required. The desired kernel accuracy is a range from zero to 99.9%. Choosing the desired kernel accuracy is a balance between accuracy and speed. Choosing an accuracy of 100% might result in computations taking an hour or more; it has been found that an input accuracy of 80% provides very fast acceptable results.

The total energy in the original kernel is computed by adding the absolute values of all the pixels (kernel elements). The desired minimum total energy is then computed by multiplying the total energy by the desired accuracy. Then the total energy of smaller sub-kernels is computed until the smallest kernel with total energy above the desired value is found. The sub-kernels are co-centered with the original kernel. That sub-kernel is then used in convolutions.

The actual convolution of the source image is performed twice in steps 685 and 690, an energy convolution and a voltage convolution. The first convolution is energy, as is commonly described in optical texts, where each pixel intensity is the sum of the component products (energy) from the kernel and source image. The second convolution is performed with voltages or "amplitude", using the image phase information described in 570. In the voltage case, each resulting pixel intensity is the square of the sum of the component voltages from multiplying the kernel elements by their corresponding source image pixels.

The two convolved images are blended in 695 to produce the simulated wafer aerial image (150 or 350). The "partial coherence" of the light from a microscope is equivalent to the sigma, so that a point illuminator, with sigma approaching zero, produces a coherent image, with maximal phase interference as produced by the voltage convolution. A large illuminator, sigma 1, produces incoherent images, with minimal phase interference, as produced by the energy convolution. In the preferred implementation the partial coherence, or blending ratio between the two images is computed using this method.

OPTIMIZATIONS

As the image was resampled in step 414, it may be preferable to enlarge the image after the aerial image, the simulated wafer resist image or the simulated processed wafer are generated. Such enlargement would be to present a better image for the user, and can be done in ways known to those of skill in the art, such as the Microsoft operating system display function StretchDIBits. The images may be converted to floating point pixel values at step 414 and following for improved accuracy; this also allows use of smaller images. Conversion to floating point may occur at any step in the process, and preferably occurs before convolution. Special microprocessor instructions, such as Intel's MMX instruction set, may be used to accelerate the image processing functions, especially erosion, dilation, blending, scaling, and convolution. Separable convolution may be used for the convolution steps, and is described in *Digital Image Processing*, Gonzalez and Woods, 1992, Addison Wesley, which is incorporated by reference. Computation speed is increased by separating the 2-dimensional kernel into two 1-dimensional kernels, as is well understood in image processing.

Annular illumination can be simulated in the convolving step. The illumination source in the stepper is often modified from a circle with a diameter defined by the "sigma" value, to be an annulus (donut shape) where the center is blocked. The annulus is defined by its outer radius and inner radius. Use of such an annulus increases the allowed errors in focus and exposure in the stepper. This effect can be simulated by subtracting the image that would be produced by the blocked region of the illuminator. This subtraction is performed on the blurring convolution kernel, or by adding a second convolution of image 318, dividing the result by the area ratio of the annulus inside radius and outside radius, and finally subtracting from the first convolution of image 318. In both cases the blurring of the subtracted image is computed from the inner radius.

COMPUTER SYSTEM EMBODIMENT

FIGS. 8A and 8B illustrate a computer system 900 suitable for implementing embodiments of the present invention. FIG. 8A shows one possible physical form of the computer system. Of course, the computer system may have many physical forms ranging from an integrated circuit, a printed circuit board and a small handheld device up to a huge super computer. In a preferred embodiment, computer system 900 is a personal computer with at least 64 MB memory, a CPU running faster than 200 MHz, and hard disk capacity larger than 5 GB, and any operating system, such as a Microsoft operating system, Sun Solaris, Linux, Apple operating system version X, or others. The system 900 includes a monitor 902, a display 904, a housing 906, a disk drive 908, a keyboard 910 and a mouse 912. Disk 914 is a computer-readable medium used to transfer data to and from computer system 900.

FIG. 8B is an example of a block diagram for computer system 900. Attached to system bus 920 are a wide variety of subsystems. Processor(s) 922 (also referred to as central processing units, or CPUs) are coupled to storage devices including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data and the like and is typically a secondary storage medium (such as a hard disk) that is slower than primary storage. It will be appreciated that the information retained within fixed disk 926, may, in appropriate cases, be incorporated in standard fashion as virtual memory in memory 924. Removable disk 914 may take the form of any of the computer-readable media described below.

CPU 922 is also coupled to a variety of input/output devices such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter.

Although the foregoing invention has been described in some detail for purposes of clarity of understanding, it will be apparent that certain changes and modifications may be practiced within the scope of the appended claims. For example, the video image input may come from a wide variety of sources, such as inspection tools, repair tools, or other microscopes, any of which may use light of any wavelength, SEM, FIB or other image sources. Also, analysis may be made of a variety of media, and not necessarily a photographic mask. Also, any type of light microscopic may be used as well as an electron microscope or other particle microscope. Therefore, the described embodiments should be taken as illustrative and not restrictive, and the invention should not be limited to the details given herein but should be defined by the following claims and their full scope of equivalents.

We claim:

1. A method of producing a simulated aerial image of a wafer, said method comprising:
   receiving a source image representing a photomask;
   receiving a projection lens image and an illumination aperture image representing the optics of a device;
   producing an effective lens image by convolving said projection lens image with said illumination aperture image;
   generating a convolution kernel using said effective lens image; and
   performing convolution on said source image using said convolution kernel to produce said simulated aerial image of said wafer.

2. A method as recited in claim 1 wherein said device is a wafer stepper or a scanner.

3. A method as recited in claim 1 further comprising:
   computing an erosion amount for said source image by taking into account a dilation amount needed to compensate for edge diffraction; and
   performing erosion on said source image by said erosion amount to produce an intermediate image.

4. A method as recited in claim 1 wherein said source image is a video image from a video inspection machine, an image from mask design data, or a non-optical image.

5. A method as recited in claim 1 further comprising:
   summing the total energy in said convolution kernel; and
   determining the smallest kernel that includes a desired fraction of said total energy, whereby an optimal convolution kernel size is determined.

6. A method as recited in claim 1 wherein said performing convolution includes:
   producing an energy convolution;
   producing a voltage convolution; and
   blending said energy and voltage convolutions to produce said simulated aerial image of said wafer.

7. A method as recited in claim 1 further comprising:
   performing erosion on said simulated aerial image to produce a simulated wafer resist image, whereby said simulated wafer resist image represents the effects of exposure and development of photoresist on said wafer.

8. A method as recited in claim 1 wherein said source image is from a video machine and wherein said step of performing convolution includes:
   reducing the blurring caused by said convolution to compensate for a deconvolution step not being performed.

9. A method as recited in claim 1, said device being arranged to project images onto said wafer.

10. A method of producing a simulated aerial image of a material used to make an integrated circuit, said method comprising:
    receiving a source image representing a photomask;
    receiving a projection lens image and an illumination aperture image representing the optics of a device;
    producing an effective lens image by convolving said projection lens image with said illumination aperture image;
    generating a convolution kernel using said effective lens image; and
    performing convolution on said source image using said convolution kernel to produce said simulated aerial image of said material.

11. A method as recited in claim 10 wherein said source image is an image from mask design data, or a non-optical image.

12. A method as recited in claim 10 wherein said device is a wafer stepper or a scanner.

13. A method as recited in claim 10 further comprising:
    summing the total energy in said convolution kernel; and
    determining the smallest kernel that includes a desired fraction of said total energy, whereby a convolution kernel size is determined.

14. A method as recited in claim 10 wherein said performing convolution includes:
    producing an energy convolution;
    producing a voltage convolution; and
    blending said energy and voltage convolutions to produce said simulated aerial image of said wafer.

15. A method as recited in claim 10 further comprising:
    performing erosion on said simulated aerial image to produce a simulated wafer resist image, whereby said simulated wafer resist image represents the effects of exposure and development of photoresist on said wafer.

* * * * *